(12) United States Patent
Mai et al.

(10) Patent No.: US 7,761,831 B2
(45) Date of Patent: Jul. 20, 2010

(54) ASIC DESIGN USING CLOCK AND POWER GRID STANDARD CELL

(75) Inventors: Tony Mai, Kanata (CA); Bruce Millar, Stittsville (CA); Susan Coleman, Ottawa (CA); Seanna Pike, Kanata (CA)

(73) Assignee: MOSAID Technologies Incorporated, Kanata, Ontario (CA)

( * ) Notice: Subject to any disclaimer, the term of this patent is extended or adjusted under 35 U.S.C. 154(b) by 541 days.

(21) Appl. No.: 11/322,160

(22) Filed: Dec. 29, 2005

(65) Prior Publication Data

US 2007/0157144 A1 Jul. 5, 2007

(51) Int. Cl.
*G06F 17/50* (2006.01)
(52) U.S. Cl. .......................................... 716/10; 716/11
(58) Field of Classification Search .................. 716/1–2, 716/7–13, 16–17, 6
See application file for complete search history.

(56) References Cited

U.S. PATENT DOCUMENTS

| | | | | |
|---|---|---|---|---|
| 5,691,662 A * | 11/1997 | Soboleski et al. | ........... | 327/292 |
| 6,080,206 A | 6/2000 | Tadokoro et al. | | |
| 6,205,571 B1 * | 3/2001 | Camporese et al. | ............ | 716/2 |
| 6,370,678 B1 * | 4/2002 | Culler | ......................... | 716/18 |
| 6,397,375 B1 | 5/2002 | Block et al. | | |
| 6,467,074 B1 * | 10/2002 | Katsioulas et al. | ............ | 716/17 |
| 6,510,545 B1 * | 1/2003 | Yee et al. | ....................... | 716/12 |
| 6,522,186 B2 | 2/2003 | O'Mahony et al. | | |
| 6,617,621 B1 * | 9/2003 | Gheewala et al. | ........... | 257/207 |
| 6,823,499 B1 * | 11/2004 | Vasishta et al. | ................ | 716/7 |
| 6,910,194 B2 * | 6/2005 | Mielke et al. | ................... | 716/6 |
| 7,107,200 B1 * | 9/2006 | Korobkov | ..................... | 703/13 |
| 2003/0042963 A1 * | 3/2003 | Anders et al. | ............... | 327/295 |
| 2003/0062949 A1 * | 4/2003 | Suzuki | ........................ | 327/564 |
| 2004/0073881 A1 * | 4/2004 | Nassif et al. | ................... | 716/10 |
| 2004/0243956 A1 * | 12/2004 | Tetelbaum et al. | ............. | 716/6 |
| 2005/0114820 A1 * | 5/2005 | Restle | .......................... | 716/13 |
| 2005/0138588 A1 * | 6/2005 | Frenkil | ............................. | 716/6 |
| 2005/0227507 A1 | 10/2005 | O'Mahony et al. | | |
| 2006/0095872 A1 * | 5/2006 | McElvain et al. | .............. | 716/1 |
| 2006/0123376 A1 * | 6/2006 | Vogel et al. | .................... | 716/11 |
| 2006/0138592 A1 * | 6/2006 | Block et al. | .................. | 257/532 |
| 2007/0028193 A1 * | 2/2007 | Correale et al. | ................. | 716/1 |
| 2007/0038430 A1 * | 2/2007 | Walker et al. | .................. | 703/14 |

OTHER PUBLICATIONS

Chan, S.C., et al., "Design of Resonant Global Clock Distributions," *Proc. of the 21st Internat'l Conf. on Computer Design* (ICCD 03), 1063-6404/03, © 2003 IEEE.

* cited by examiner

*Primary Examiner*—Paul Dinh
(74) *Attorney, Agent, or Firm*—Hamilton, Brook, Smith & Reynolds, P.C.

(57) ABSTRACT

An integrated power and clock grid which is capable of being placed and routed using ASIC software design tools. The integrated grid comprises three types of grid unit cells having power rails and clock lines. The power rails and clock lines comprise different orientations in the different grid unit cells.

22 Claims, 14 Drawing Sheets

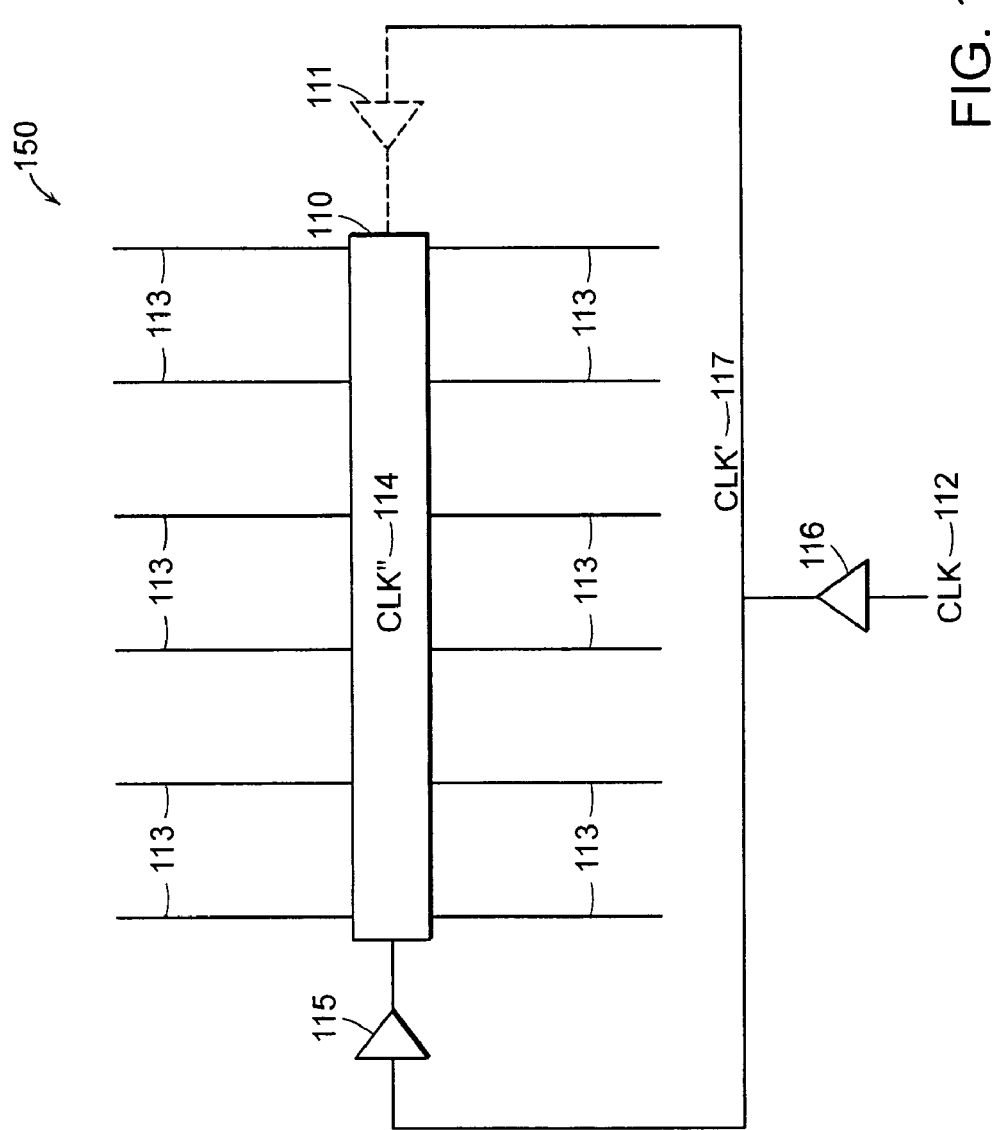

Corner Grid Unit Cell (C)

ASIC DESIGN USING CLOCK AND POWER GRID STANDARD CELL

BACKGROUND OF THE INVENTION

An Application-Specific Integrated Circuit (ASIC) is an integrated circuit custom designed for a particular use, also referred to as a System on Chip (SoC). A few examples of ASIC implementations may be found in cellular phones, automotive computers, and personal data assistants (PDAs). The mentioned examples have limited functionality and are therefore used to perform specific tasks. A contrasting example to the ASIC design is a microprocessor. Microprocessors are designed to adapt to many purposes.

The first phase of an ASIC design typically begins with a team of design engineers who determine the functional requirements of the ASIC to be built. Once the required functions have been determined, the design team then constructs a description of the ASIC using a hardware description language (HDL). This phase of the fabrication process is usually referred to as the Register Transfer Level (RTL) design. HDL is used to describe the circuit's operation, its design, and tests to verify its operation by means of simulation. A logic synthesis tool, such as Design Compiler™ by Synopsys, may then be used to transform the RTL design into a large collection of lower-level constructs called standard cells.

Standard cells are the basic building blocks of ASICs. Standard cells, typically taken from a library, consist of pre-characterized collections of gates. The standard cells used in the ASIC design are specific to the intended function of the ASIC design. The resulting collection of standard cells and a power grid, providing the necessary electrical connections, is called a gate-level net list. The gate-level net list is processed by a placement tool, which one-by-one places the individual standard cells onto a designated region within the power grid. Standard cells use a variable number of metal layers for local routing within the cell depending on the complexity of the cell design. The placement of the standard cells is subject to a variety of specified constraints. Therefore, a height requirement is typically set upon standard cells such that all standard cells have a height equal to the required height or a multiple thereof.

During the final stages of ASIC fabrication, a routing tool forms the electrical connections between the standard cells and the power grid. Estimations on delays, clock skew, parasitic resistances and capacitances, and power consumptions are also made and used in a final round of testing. During this round of testing, alterations to the design may be made in order to increase the performance of the device. Once the testing is complete, the design is finally released for chip fabrication.

One area of importance when designing ASICs is clock distribution. An ASIC clock distribution network is characterized by layout area used, clock insertion delay and clock skew. Clock skew is a phenomenon seen in synchronous circuits and occurs when a clock signal arrives at different components of the circuit at different times; in other words, when the clock insertion delay from the clock source differs to each component. A clock signal is generated by a clock circuit and is distributed throughout the ASIC in a balanced network of clock buffers and metal routing. Two general architectures for ASIC clock distribution networks are the Clock Trunk and the Clock Tree, each having physical and electrical characteristics which differ, and depending on the application, one clock architecture may be more beneficial to use in an application than another.

The clock trunk architecture incorporates a large central conductor or trunk in its design, which is driven from one or both ends, with smaller branch conductors extending perpendicularly out from the trunk to distribute the clock signal to the ASIC components on either side of the trunk. Because the trunk clock distribution network has unequal metal paths from the clock source to the driven components, it is inherently unbalanced and introduces a small amount of clock skew in the clock distribution due to differing RC delays in the metal paths to each component.

FIG. 1 displays an example of a clock trunk structure 150. Clock trunk structure 150 includes a central conductor 110, comprising smaller branch conductors 113 extending perpendicularly out from the central conductor to distribute the clock signal 112 to the ASIC components on either side of the conductor. The clock signal CLK 112 is initially passed through a buffer 116 resulting in a clock signal CLK' 117. Signal CLK' 117 is passed through both sides of the conductor 110 through buffers 115 and 111. Buffer 111 is an optional buffer used to minimize clock skew.

The tree architecture is a balanced clock distribution scheme, having equal paths from the clock source to the components by design. The tree architecture uses a central distribution point, symmetrical branching, buffering and sub-branching to distribute clocks to components. A clock tree may also have a root and a trunk to convey the clock source to the first branching point. The metal conductors in each branch of a clock tree are usually so closely matched as to introduce negligible clock skew into the clock distribution network on their own. However, for a clock tree to exhibit low skew, all of the clock buffers within the network must have closely matched characteristics and the loads presented to these buffers must be balanced. The branched symmetry of clock trees makes them practical to be generated automatically by ASIC tools. Although quick to generate a complete clock network conforming to worst-case skew margins, a major failing of these ASIC tools, is to minimize the clock skew to levels attainable in custom clock tree designs.

FIG. 1A displays a simplified row-based cell layout 100 featuring an embedded clock tree 107. Cell layout 100 comprises two power supply rails VDD 101 and VSS 103, forming a power grid. Standard cells 105 are placed in the power grid between the voltage supply rails 101 and 103. A clock circuit 109 generates a clock signal which is sent to destinations, or nodes, 111, 113, 115 and 117 of the clock tree 107. A clock signal, originating from clock circuit 109, should have the same distance to travel to node 113 as it does to nodes 111, 115, and 117. If the time taken for the clock signal to reach node 113 is greater or less than the time taken to reach nodes 111, 115, or 117, a clock skew is present. The greater the deviation of the time difference reaching each node, the greater the clock skew.

A more detailed view of a clock tree may be seen in FIG. 2A. An H-clock tree 200 is typically used in ASIC designs. Clock tree 200 comprises four leaves, or nodes, 201, 202, 203, and 204. The clock tree 200 is built using a series of metal wires 210 and buffers 211. A clock signal clk is sent through the tree, resulting in a signal clk' in node 202 and a signal clk" in node 204.

The timing diagram of FIG. 2B graphically depicts clock signals clk, clk' and clk". As may be seen from the timing diagram, the insertion delays of the rising edges of signals clk' and clk" are significantly different, causing a skew. Such a difference needs to be addressed in the timing budget of the design.

SUMMARY OF THE INVENTION

A circuit is formed from a plurality of design cells. The design cells comprise grid cells that together form a clock grid, having rails in first and second orientations and circuit cells forming circuits within and coupled to the clock.

The grid cells may also be used to form a power grid, where the power grid may provide a decoupling capacitance between power and ground lines in each grid cell. The power grid may also provide a shielding for the clock grid. Each grid cell may further comprise at least one power rail and at least one clock line in the same metal layer. The at least one power rail and at least one clock line may be in one of the first and second orientations.

There may be multiple types of grid cells. Those providing power and clock lines in respective orientations and those proving and interconnecting rails of different orientations. One type of grid cell may comprise at least one power rail and at least one clock line, in a first orientation. Another type may comprise at least one power rail and at least one clock line in a second orientation and at least one other power rail in a first orientation.

A third type of grid cell may comprise at least one power rail and at least one clock line in each of the first and second orientations. The third grid cell type may also interconnect the power rails of different orientation and clock lines of different orientation.

A method of forming the circuit comprises designing a clock grid of individual grid cells and designing a circuit of individual standard cells within and coupled to the clock grid. The method may also provide an integrated power and clock grid. The method may comprise placing individual grid cells with an ASIC tool, where the grid cells comprise power and clock elements, and placing individual standard cells with the ASIC tool, the ASIC tool being a software tool.

A design system may also be formed. The design system comprises at least one standard cell, a plurality of grid unit cells, placing software that places the plurality of grid unit cells and the at least one standard cell, and routing software. The routing software provides interconnections between the plurality of grid unit cells; between the at least one standard cell and the plurality of grid unit cells; and between the at least one standard cell and at least one other standard cell.

The design system may also comprise first orientation cell means for providing clock and power lines in a first orientation, second orientation cell means for providing clock and power lines in a second orientation, and interconnection cell means for providing and interconnecting clock and power lines in a first orientation and clock and power lines in a second orientation.

The integration of the power and clock grids reduce clock skew in an application which is easily implemented by ASIC tools, and also provides the necessary decoupling and shielding without adding additional devices to the ASIC design. The integrated clock and power grid is also capable of being fabricated on fewer metal layers, thus greatly lowering the complexity of the ASIC design.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 1 is a schematic of a clock trunk;

DETAILED DESCRIPTION OF THE INVENTION

A description of preferred embodiments of the invention follows.

Figure 1A:
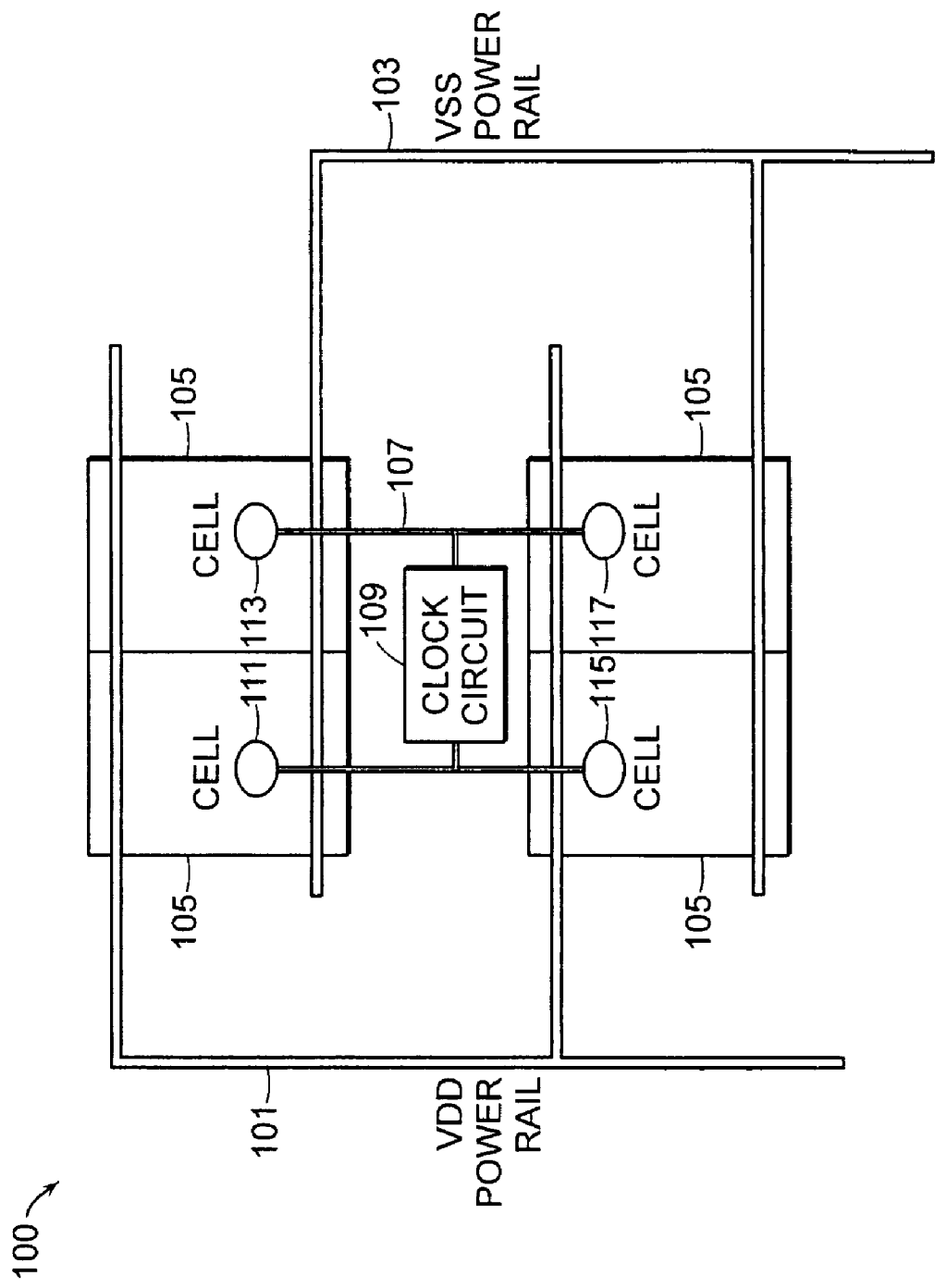
FIG. 1A displays a simplified row-based cell layout.
Figure 2B:
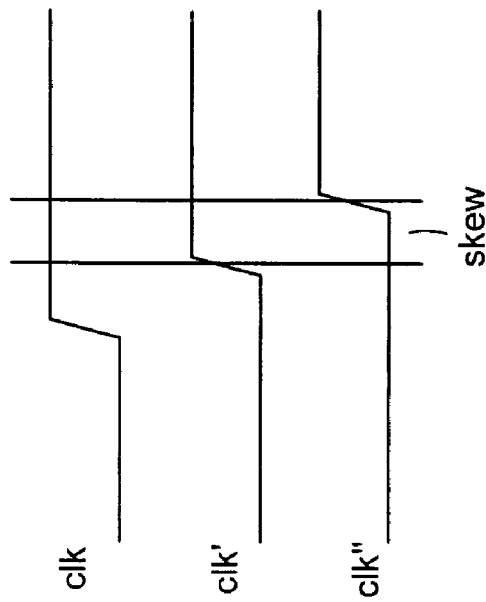
FIG. 2A is a schematic of a clock tree and FIG. 2B is a timing diagram representing the skew of the clock tree.
Figure 2A:
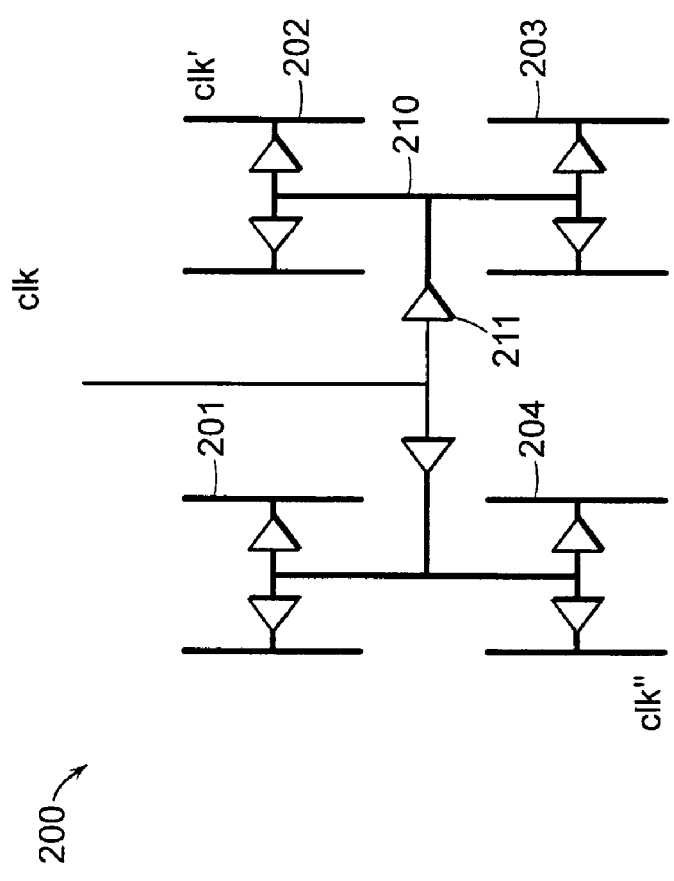

In order to achieve minimum skew in an H-clock tree, as shown in FIG. 2, nodes 201-204 must be balanced. Since each node 201-204 will see a different load, balancing the nodes becomes a difficult task.

An alternative to the clock trunk and clock tree architectures is the clock grid architecture. The grid architecture is characterized by an orthogonal array of interconnected wires driven by a plurality of matched clock buffers placed at regular intervals along the grid. The clock grid forms a single low-skew clock network, which obviates any need for balancing loads. In layout, the grid must be extended to cover all clocked components in the ASIC design. ASIC clock grids are usually custom designs, which must be merged into the place-and-rout area of the design. No commercially available ASIC tools exist today to generate clock grids automatically. By subdividing a custom clock grid into cell-sized units and making these units compatible with Standard Cell Libraries, the inventors believe that automatic clock grid generation would be feasible and practical for ASICs. Thought automatic clock grid generation capability be absent from current ASIC tool-sets, the inventors believe that Standard Cell based clock grid cells are beneficial, can be easily be placed into a layout with Standard Cells and fit seamlessly into existing ASIC design flows to yield high-performance clock distribution.

Figure 3B:
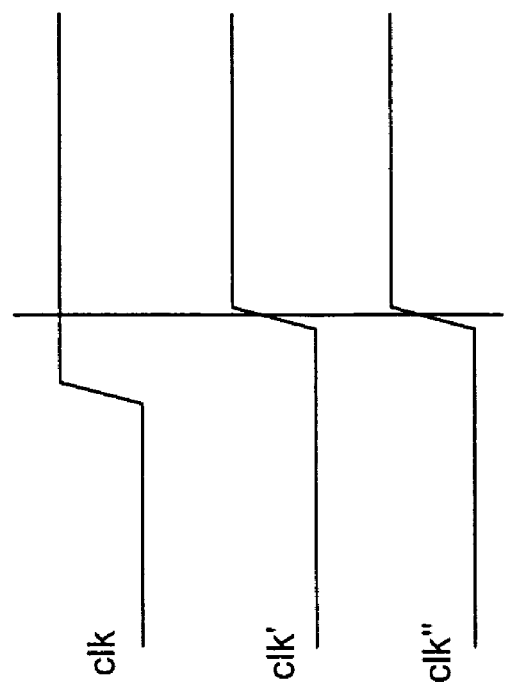
FIG. 3A is a schematic of a clock grid and FIG. 3B is a timing diagram representing the skew of the clock grid.
Figure 3A:
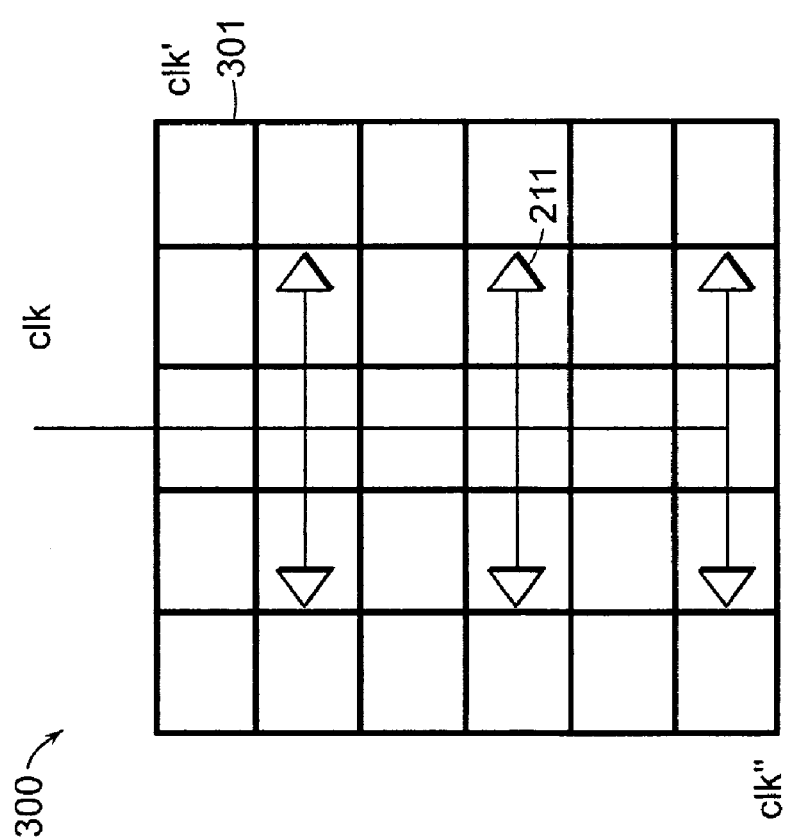

FIG. 3A shows a clock grid 300 comprised of a conduction grid 301 and buffers 211. Instead of comprising multiple nodes, as shown in the clock tree 200, the clock grid 300 of FIG. 3A comprises one common node, i.e., the conduction grid 301. Therefore, once a clock signal clk is transmitted to the clock grid 300, the different portions of the clock grid 300 will receive the signals clk' and clk" at approximately the same time since there is only one common node. The different clock signals received on the clock grid will also rise and fall at approximately the same time, as may be seen in the timing diagram of FIG. 3B. Therefore, using a clock grid system, minimum clock skew may be achieved. Note that the metal conductors forming the conduction grid have low but finite resistance. Depending on the configuration of the clock grid and the load capacitance, a small RC-based clock skew will exist between different parts of the conduction grid.

Problems arise when trying to implement the clock grid system, previously used in custom designed integrated circuits, into an ASIC design. The placement and routing tools are not designed to incorporate clock grids and therefore do not have the capacity to include them in the ASIC design. That is, the placement and routing tools are configured to place the standard cells and to route interconnections between the standard cells placed.

A power and clock design disclosed here allows for minimum clock skew and is also compatible with various ASIC designs tools. An integrated power and clock grid comprising grid unit cells is presented and shown in FIG. 4. The integrated clock and power grid 400 is comprised of a plurality of grid unit cells which serve as the building blocks of the integrated power and clock grid 400. In a similar fashion to the standard cells of ASIC designs, the grid unit cells are placeable one-by-one and may be tiled together to form the integrated power and clock grid 400. Thus, the grid unit cells may be handled and placed by the ASIC placement and routing tools just in a similar manner in which these tools are used for the standard cells.

Figure 4:
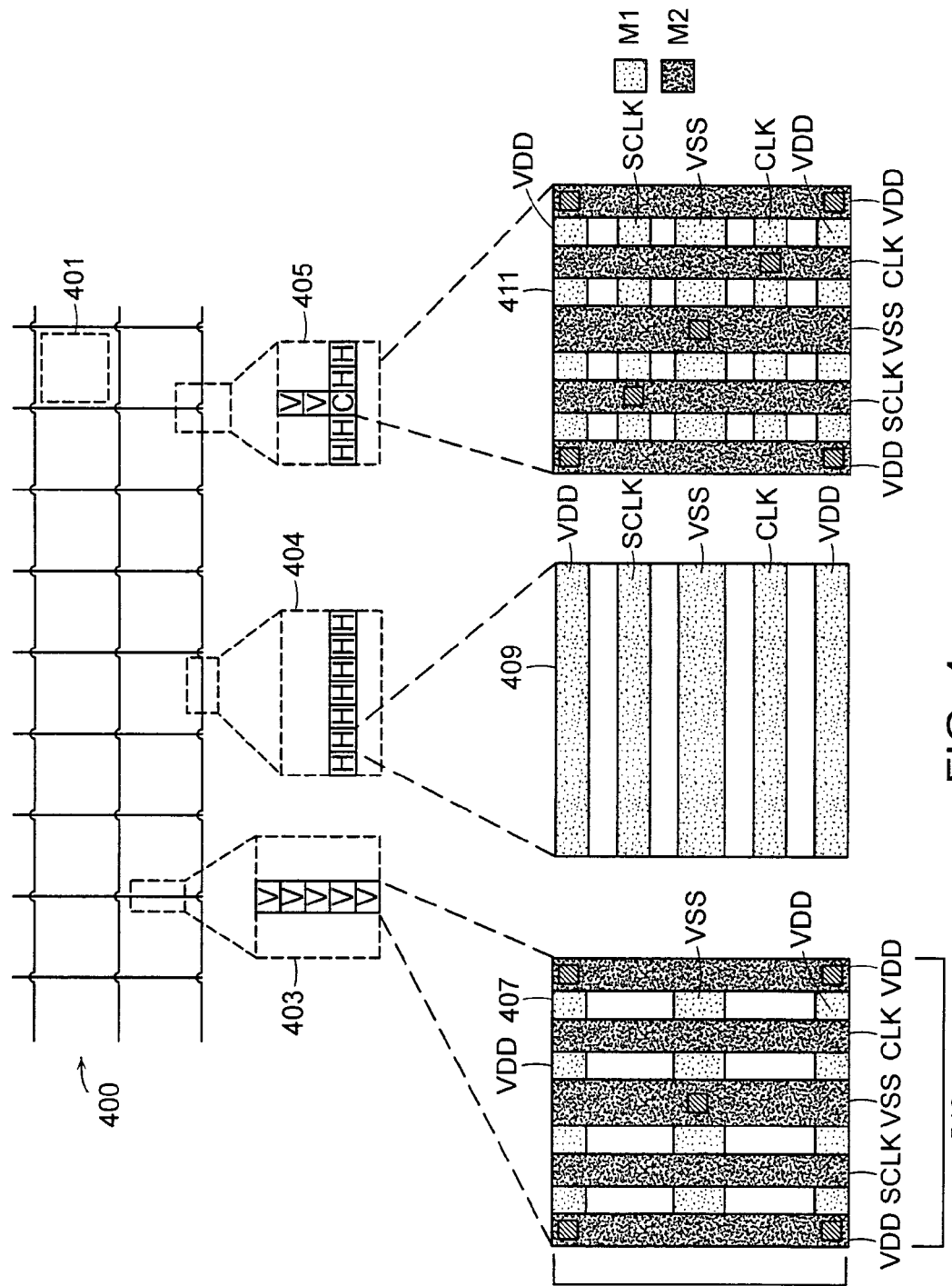
FIG. 4 depicts an implementation of a grid system incorporating horizontal, vertical and corner grid unit cells.

As shown in FIG. 4, according to an embodiment of the invention, the integrated power and clock grid 400 is composed of vertical sections 403, horizontal sections 404, and intersections 405 of the vertical and horizontal sections. In addition, the grid sections 403, 404 and 405 are composed of three different types of grid unit cells. More specifically, the vertical section 403 includes plural vertical grid unit cells 407, the horizontal section 404 includes plural horizontal grid unit cells 409, and intersections 405 includes a corner grid unit cell 411. That is, the vertical grid unit cells 407 are used in constructing the vertical sections 403 of the grid 400, while the horizontal grid unit cells 409 constitute the horizontal sections 404 of the grid 400. Corner grid unit cells 411 are designed to constitute the intersections 405 between the horizontal and vertical sections 404 and 403, respectively, and therefore serve as an interconnection coupler for the horizontal and vertical grid unit cells 409 and 407, respectively, at the intersections 405.

As can be seen from FIG. 4, the horizontal section 404 of the grid 400 is fabricated by linearly arranging the horizontal grid unit cells 409 in a horizontal direction. Similarly, the vertical section 407 of the grid 400 is fabricated by linearly arranging the vertical grid unit cells 407 in a vertical direction. The corner grid unit cell 411 is used at the intersections 405 of the grid 400 in such a way to interconnect the vertical grid unit cells 407 used in the vertical sections 403 of the grid, with the horizontal grid unit cells 409, used in the horizontal sections 404 of the grid.

Here, the terms "horizontal" and "vertical" are used throughout the description for simplicity, but may include any two different orientations as long as they are substantially perpendicular to each other.

The vertical grid unit cell 407, the horizontal grid unit cell 409, and the corner grid unit cell 411 will be further explained hereinafter, referring to FIGS. 6 to 12 which provide simplified topographical views for the respective grid unit cells.

Figure 5:
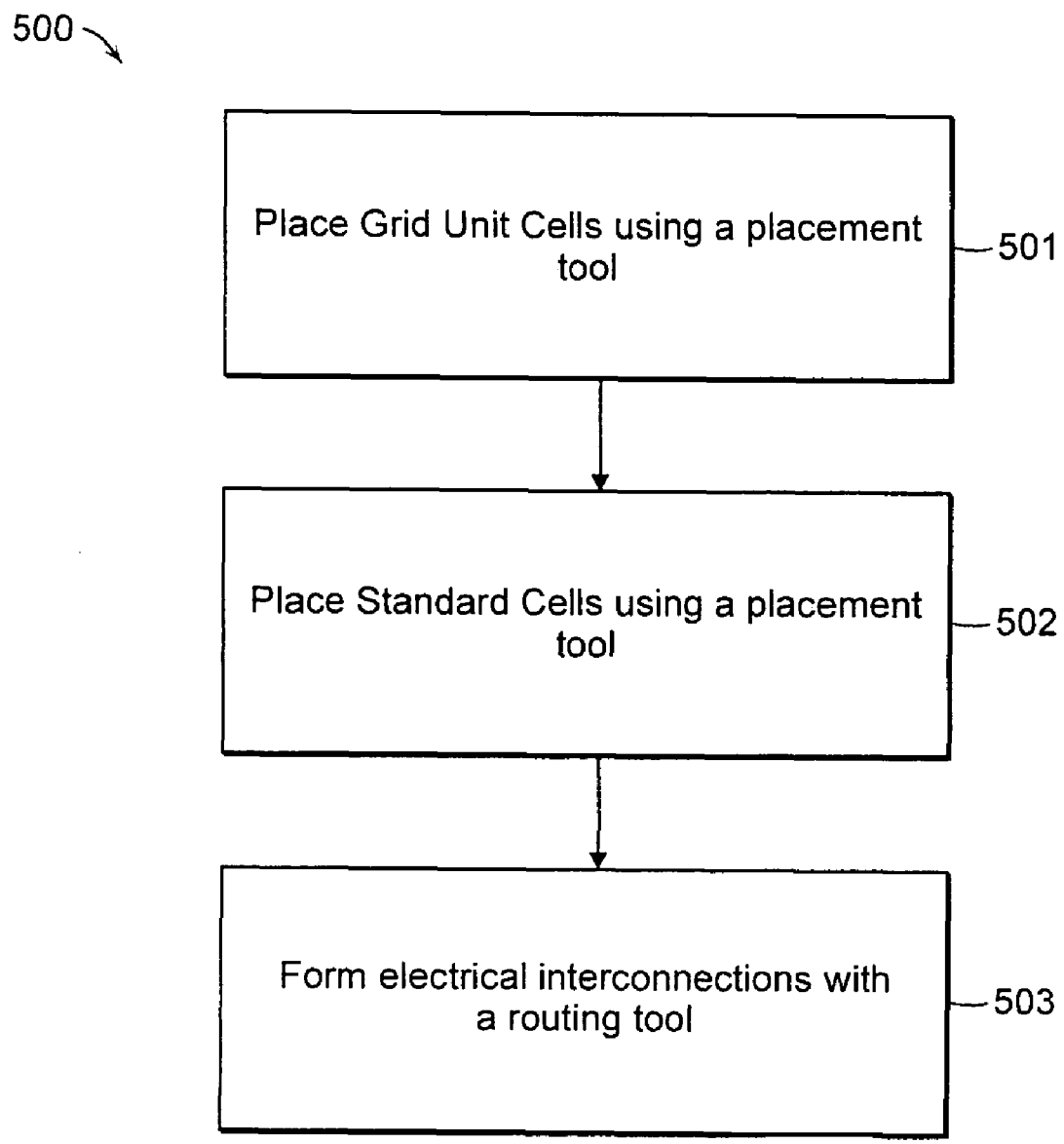
FIG. 5 is a flow chart describing grid design steps.

FIG. 5 is a flow chart 500 showing the steps of designing ASICs comprising the integrated power and clock grid 400 of FIG. 4. First, step 501 involves organizing grid unit cells into a desired grid formation using a placement tool. FIG. 4 shows an illustrative example of how the grid unit cells are placed.

The next step of forming an integrated power and clock grid is to place standard cells using the placement tool, as illustrated in step 502. The placement tool used in steps 501 and 502 may be the conventional ASIC placement tools, or may be especially designed for placing the grid unit cells 407, 409 and 411 and the standard cells. The standard cells, which provide the logic of the ASIC device to be built, are placed in grid openings 401. Multiple standard cells may be placed in each grid opening.

Finally, electrical interconnections are provided between individual grid unit cells; between individual standard cells and the grid unit cells; and between the various individual standard cells (step 503). The electrical interconnections are made using a routing tool, which may be also a conventional ASIC software tool.

According to one feature of the invention, when placed in an ASIC to form a clock and power grid, the clock and power grid cells may interconnect themselves by abutment. In other words, no routing is required by the ASIC place-and-rout tools to interconnect the clock and power grid cells to each other. More specifically, the clock and power grid cell may be configured such that neighboring cells can be electrically connected through abutment with each other by simply placing the grid cells on desired positions in an ASIC layout. However, clocks and power are routed between the grid formed by placement and the standard logic cells contained inside the clock and power grid structure.

Figure 6:
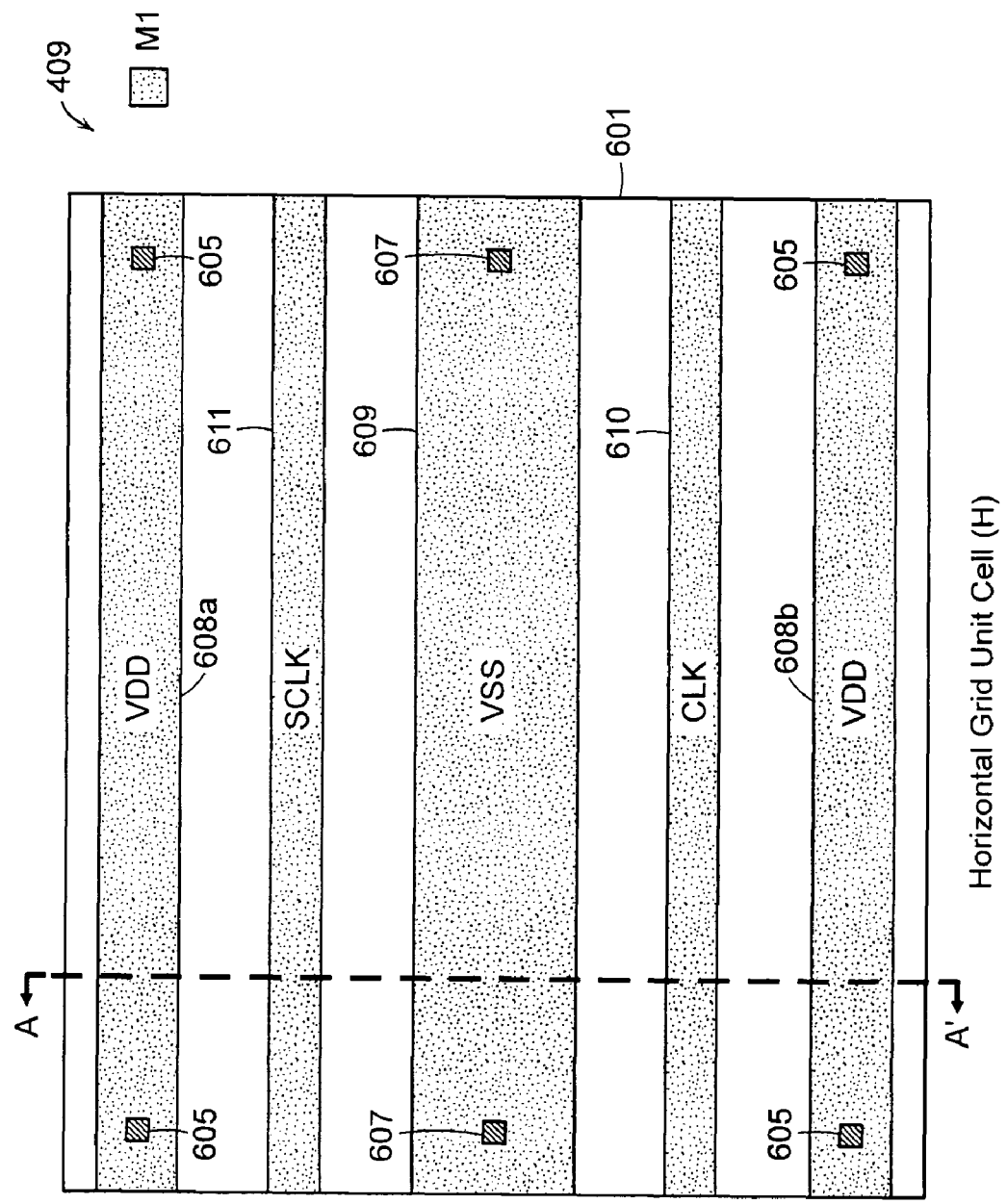
FIG. 6 is a plan view of a horizontal grid unit cell.
Figure 7A:
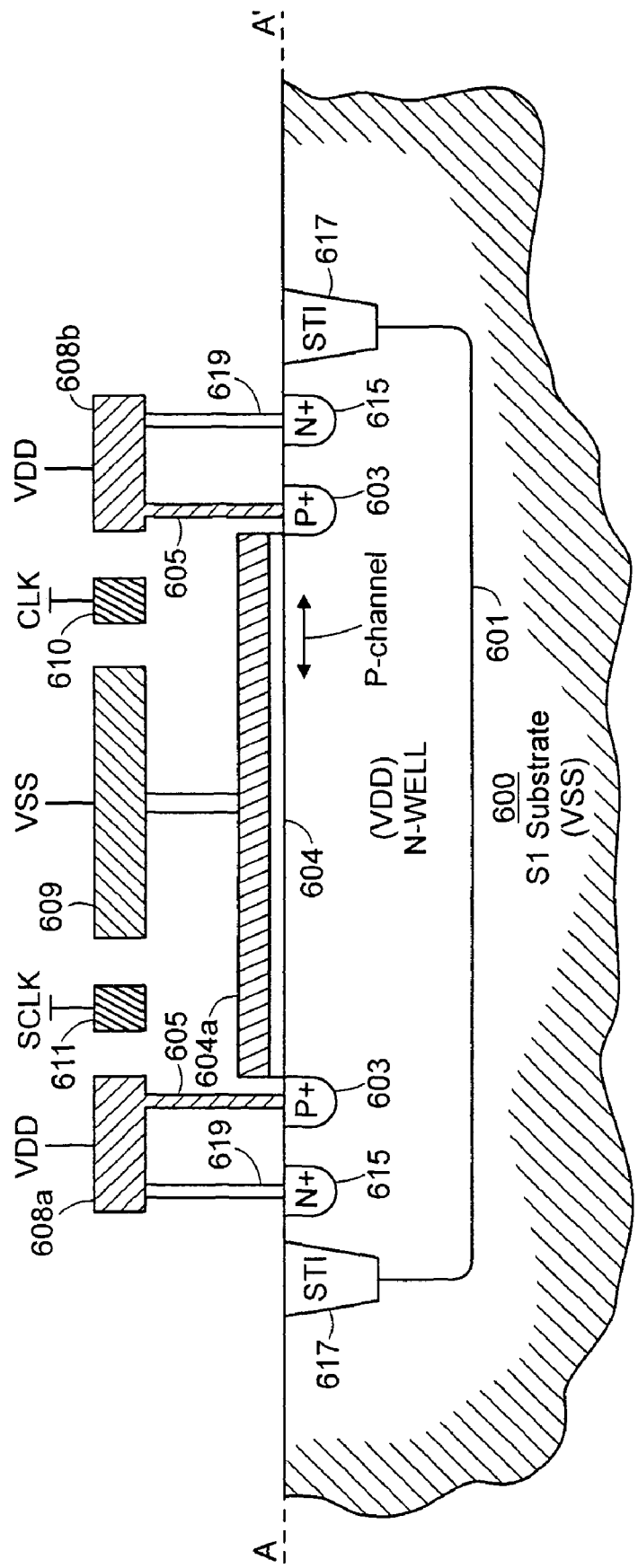
FIG. 7A depicts a cross-sectional view of a PMOS horizontal grid unit cell of FIG. 6.
Figure 7B:
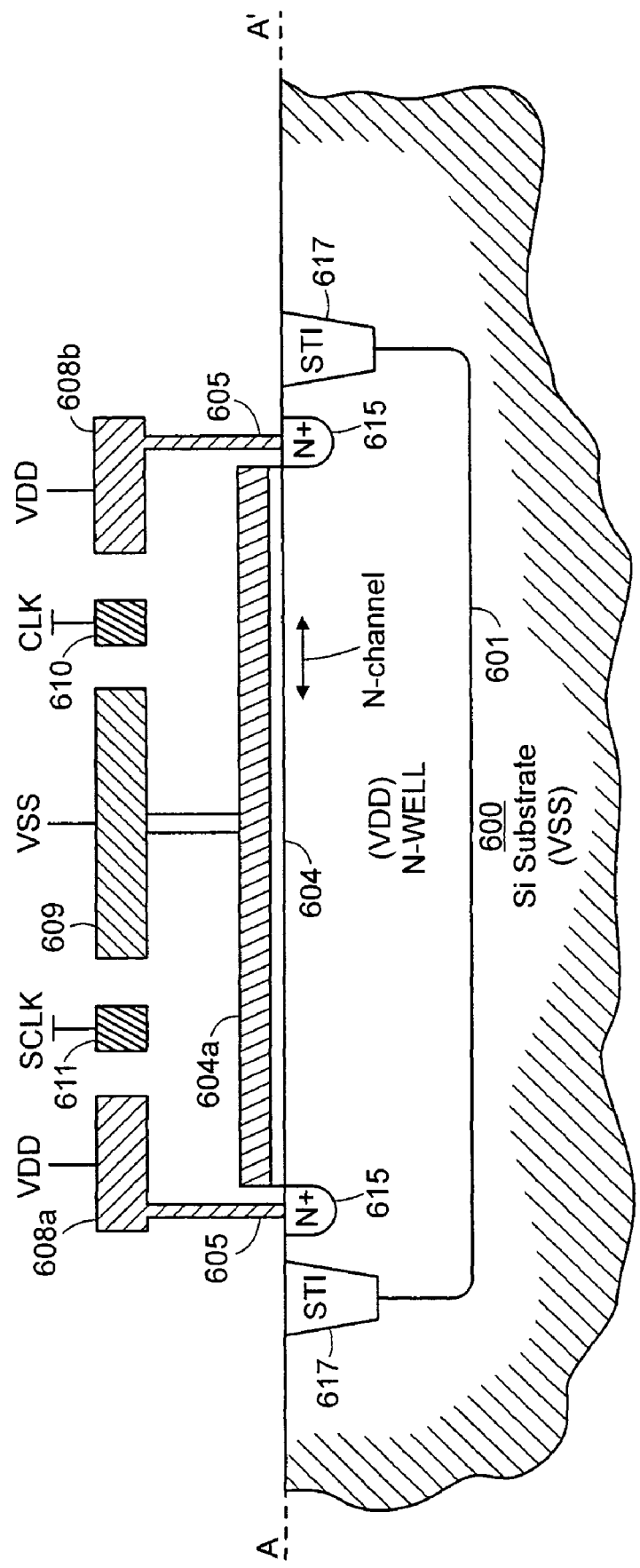
FIG. 7B depicts a cross-sectional view of an NMOS horizontal grid unit cell of FIG. 6.
Figure 8:
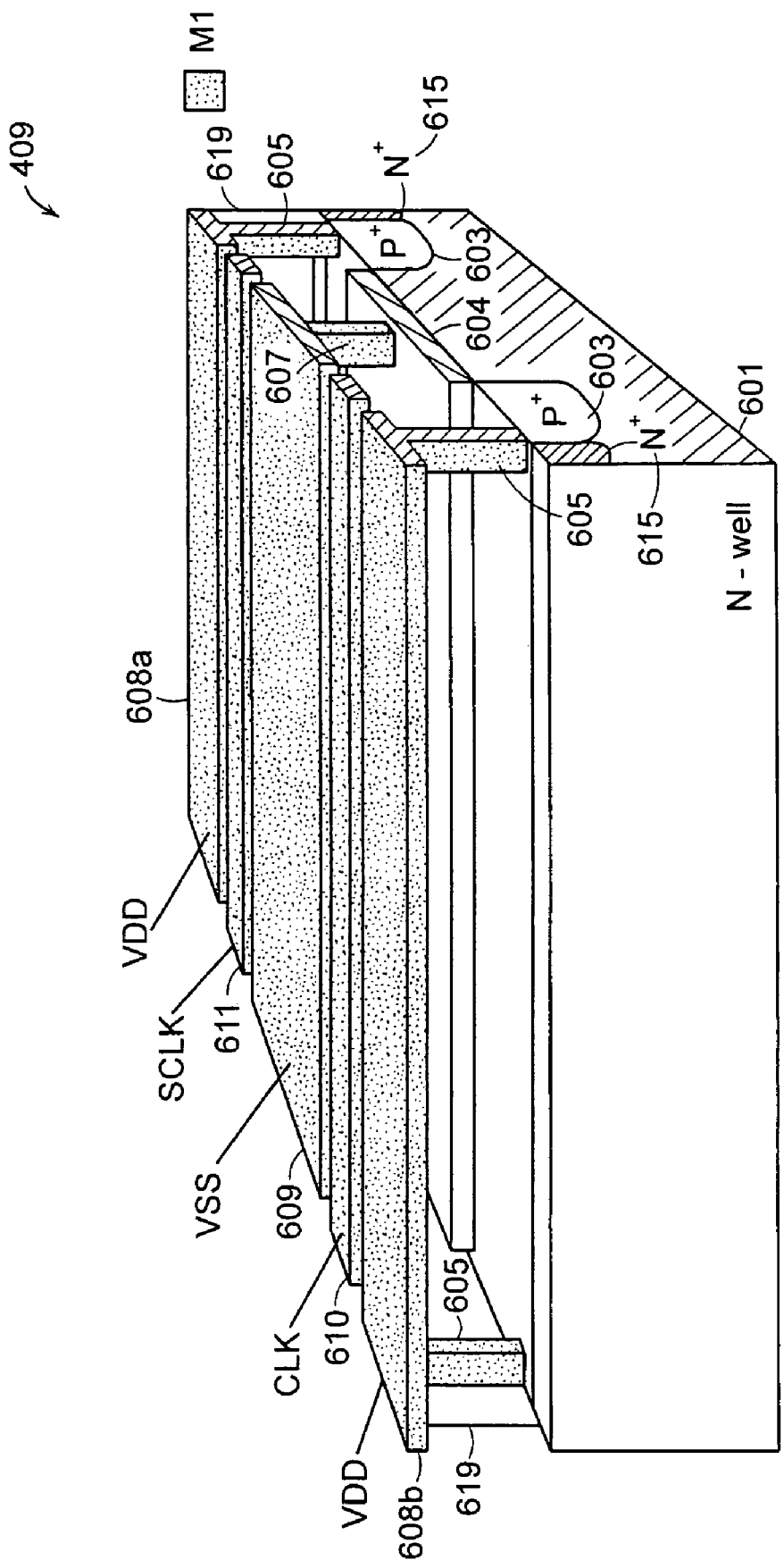
FIG. 8 shows a perspective view of the horizontal grid unit cell of FIG. 6.

A plan view of a horizontal grid unit 409 is shown in FIG. 6; a cross-sectional views (A-A') are shown in FIGS. 7A and 7B; and a perspective view is shown in FIG. 8. The components of the horizontal grid form a nonfunctional transistor that is used as a capacitor. FIG. 7A depicts a PMOS embodiment while FIG. 7B depicts an NMOS embodiment.

Referring to FIGS. 6 through 8, a mos-fet well 601 of a first conductivity is formed in a substrate and two source/drain diffusions formed within the first well 601. In the NMOS and PMOS embodiments, two n+ diffusions 615 or well taps are formed within well 601. Well taps 615 ensure that the well is at a proper electrical potential. In the NMOS embodiment, FIG. 7B, the well taps 615 serve as the source/drain of the nonfunctional n-channel transistor. The PMOS embodiment comprise additional p+ diffusions 603 which serve as the source/drain for the nonfunctional p-channel transistor. The p+ and n+ diffusions 603 and 615, respectively, are extended in horizontal direction along the first (608a and 608b) and second (609) horizontal power rails.

A gate oxide 604 is formed between the source/drain diffusions 615, for the NMOS embodiment, meanwhile for the PMOS embodiment the gate oxide 604 is formed between source/drain diffusions 603. Gate oxide 604 is covered by a conductive poly-silicon material forming the mos-fet gate 604a. A shallow trench isolation 617 is formed on the outer periphery of the device in order to provide electronic isolation.

First horizontal power rails 608a and 608b, for example VDD voltage rails, are electrically connected to the source/drains 603 by a contact 605 and a second horizontal power rail 609, for example a VSS voltage rail, is electrically connected to the gate 604a by a contact 607. In the PMOS embodiment, the first horizontal power rails 608a and 608b are also electrically connected to the well taps 615 by a contact 619. It should be appreciated that any number of contacts may be used.

A first horizontal clock line 611, for example sclk, is placed between the two power rails 608a and 609, and a second horizontal clock line 610, for example clk, is placed between the two power rails 608b and 609. It should be appreciated that any number of VDD or VSS power rails may be implemented, however the effect of decoupling occurs when two VDD rails tie the source and drain of the device and therefore provide capacitor-like characteristics.

The horizontal power rails 608 and 609 and the horizontal clock lines 610 and 611 are all fabricated on a first metallization layer M1. The clock lines disposed between the power rails are surrounded and shielded on three sides by a DC signal to reduce electromagnetic interference to nearby signals in the ASIC and to reduce electromagnetic interference from other ASIC signals to the clocks.

The grid unit cells are structured to provide VDD-VSS decoupling capacitance. The decoupling capacitance of the PMOS transistor embodiment will now be discussed in detail. The n-well 601, well tap 615, and p+ diffusions 603 form a PMOS transistor structure, as shown in FIG. 7A. That is, the p+ diffusions 603 are the source and drain of the transistor. With the gate connected to VSS and the source, drain and n-well to VDD, the p-channel transistor is always held in an on state where the channel material is fully inverted to form a conductor between source and drain. Here the gate 604a constitutes one plate of a capacitor, the source/drain 603 and formed p-channel constitute the other plate with the gate oxide 604 constituting a dielectric material between the two plates. Furthermore, the junction capacitance formed between the n-well 601, which is at VDD potential, and the silicon substrate 600, which is at VSS potential, adds significantly to the gate capacitance provided by the PMOS transistor. In this configuration the PMOS transistor provides an effective decoupling capacitance between the power and ground lines in each grid unit cell.

Decoupling is an important factor in an ASIC design. Voltages in integrated circuits tend to become unstable if a substantial amount of switching occurs in the circuit. Having a capacitance between VDD and VSS, distributed across the ASIC through the individual grid unit cells, helps keep voltage VDD stable and prevents catastrophic errors from occurring in the ASIC.

Prior methods for stabilizing voltages in ASIC designs involved adding a decoupling capacitor to each node of the clock tree; in standard practice decoupling capacitors are placed at the clock drivers. This solution required large amounts of surface area on the ASIC device. A more compact ASIC design is desirable and the power grid, of integrated grid 400, provides the necessary decoupling capacitance without the need of adding external devices.

Figure 9:
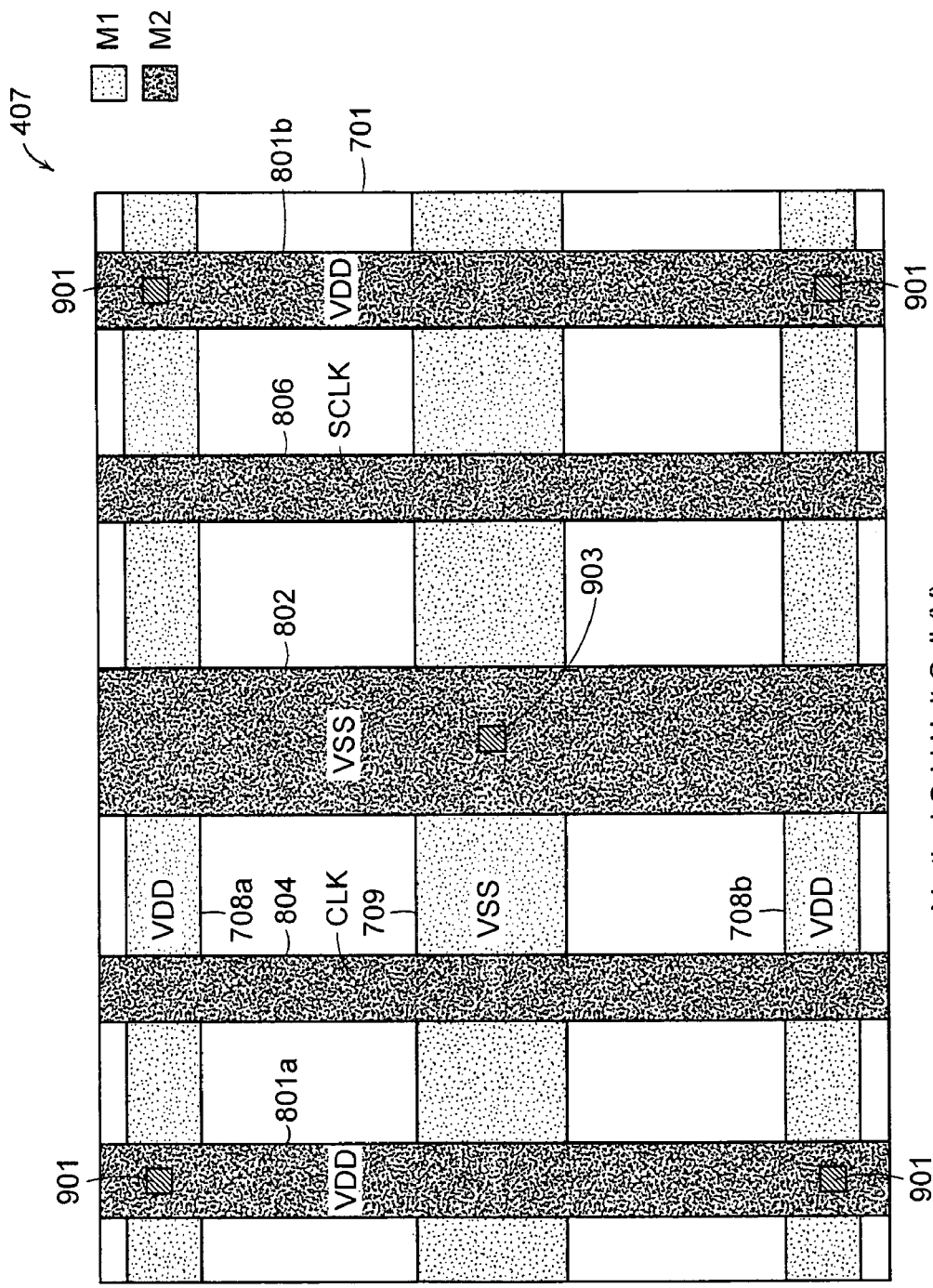
FIG. 9 shows a plan view of a vertical grid unit cell.
Figure 10:
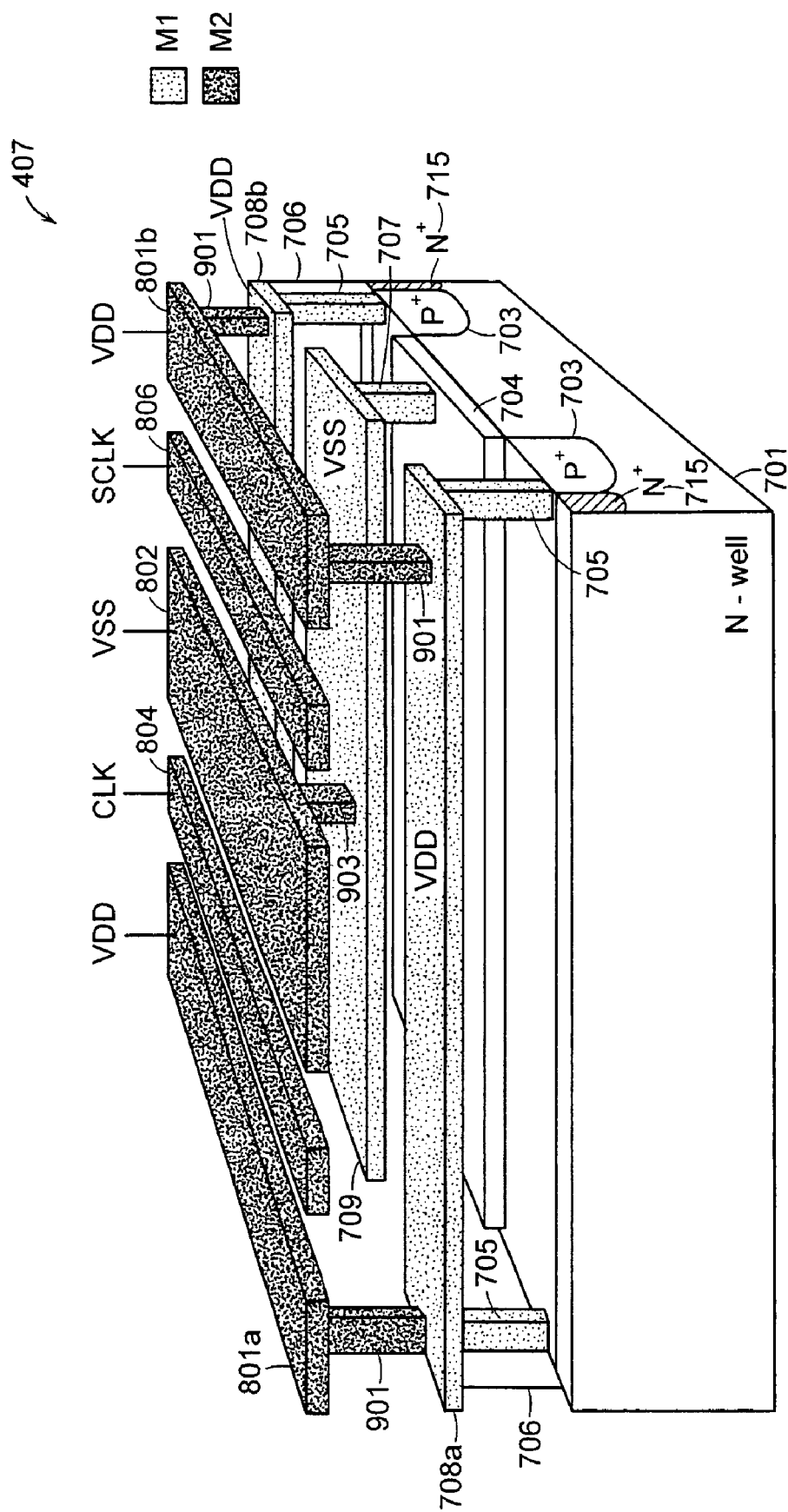
FIG. 10 is a perspective view of the vertical grid unit cell of FIG. 9.

A detailed plan view of a vertical grid unit cell 407 is shown in FIG. 9 and a perspective view thereof in FIG. 10. As illustrated in FIGS. 9 and 10, the vertical grid unit cell 407 includes two first vertical power rails 801a and 801b, for example VDD voltage rails, and a second vertical power rail 802, for example a VSS voltage rail, disposed between the two first vertical power rails 801a and 801b. Two vertical clock lines 804 and 806 (for example clocks clk and sclk, respectively) are disposed between the first vertical power rail 801a and 801b, and the second vertical power rail 802. Specifically, clock line clk 804 is situated between first vertical power rail 801a and second vertical power rail 802. Clock line sclk 806 is situated between first vertical power rail 801b and second vertical power rail 802. The vertical power rails and clock lines are all formed on a second metallization layer M2, which is fabricated on a higher level than the first metallization layer M1. In addition to the vertical power rails and clock lines on the second metallization layer M2, the vertical grid unit cell 407 includes local horizontal VDD and VSS power rails 708 and 709, respectively, in the first metallization layer M1. The vertical power rails and clock lines of the vertical grid unit cell 407 run perpendicularly to the local horizontal VDD and VSS power rails 708 and 709. The first vertical power rails 801a and 801b of the second metallization layer M2 is electrically connected to the horizontal local VDD power rails 708a and 708b respectively through a via 901 and the second vertical power rail 802 is electrically connected to the horizontal local VSS power rail 709 through a via 903.

In the vertical grid unit cell 407, the local horizontal power rails 708 and 709, and well structures 703 and 701 are, in general, structured in a similar way to that of the horizontal grit unit cell 409, except that it does not include any clock lines. The local horizontal power rails and clock lines of the vertical grid unit 407 are of the same height as the horizontal power rails in the horizontal grid unit cell 409, which are all fabricated on the first metallization layer M1. The standard cells also contain logic which are of the same height as the first metallization layer M1. As such all vertical grid unit cells must comprise voltage elements on the first metallization layer M1 in order to provide power to the various standard cells which will be placed throughout the integrated power and clock grid 400.

Similar to the PMOS transistor embodiment of the horizontal grid unit cell 409 of FIGS. 6-8, the vertical grid unit cell 407 comprises an n-type well 701 with two p+ source/drain diffusions 703 and two n+ diffusions 715 disposed therein. It should be appreciated that the vertical grid unit cell 407 may also comprise an NMOS transistor configuration. A layer of gate oxide 704 is disposed between the two p+ source/drains 703 and covered by a conductive poly-silicon material forming the mos-fet gate 704a. The local horizontal VDD power rails 708a and 708b are fabricated on the first metallization layer M1 and are connected to the p+ diffusions 703 with contacts 705 and are also connected to the n+ diffusions 715 with contacts 706. The local horizontal VSS power rail 709, also fabricated on the first metallization layer M1, is connected to the gate 704a by a contact 707.

The first vertical power rails 801a and 801b are fabricated on the second metallization layer M2, in a vertical orientation with respect to the local horizontal VDD power rails 708a and 708b, and are electrically connected to the local horizontal VDD power rails 708a and 708b by vias 901. The second vertical power rail 802, in a vertical orientation with respect to the local horizontal VSS power rail 709, is also fabricated on the second metallization layer M2 and is electrically connected to the local horizontal VSS power rail 709 by a via 903. The vertical clock lines 804 and 806 are fabricated on the second metallization layer M2 and are situated between the first vertical power rails 801a and 801b and the second vertical power rail 802.

Figure 11:
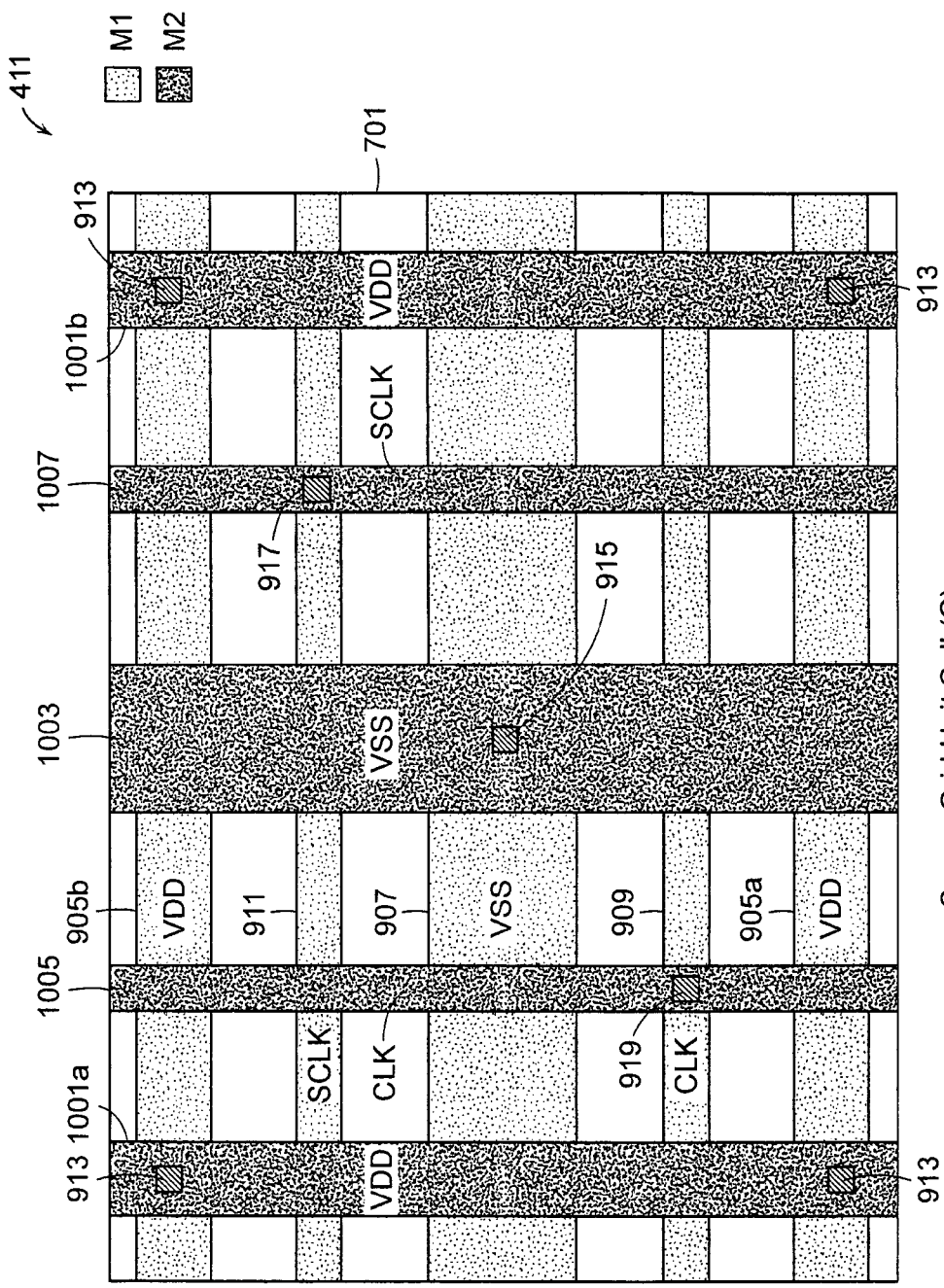
FIG. 11 shows a plan view of a corner grid unit cell.
Figure 12:
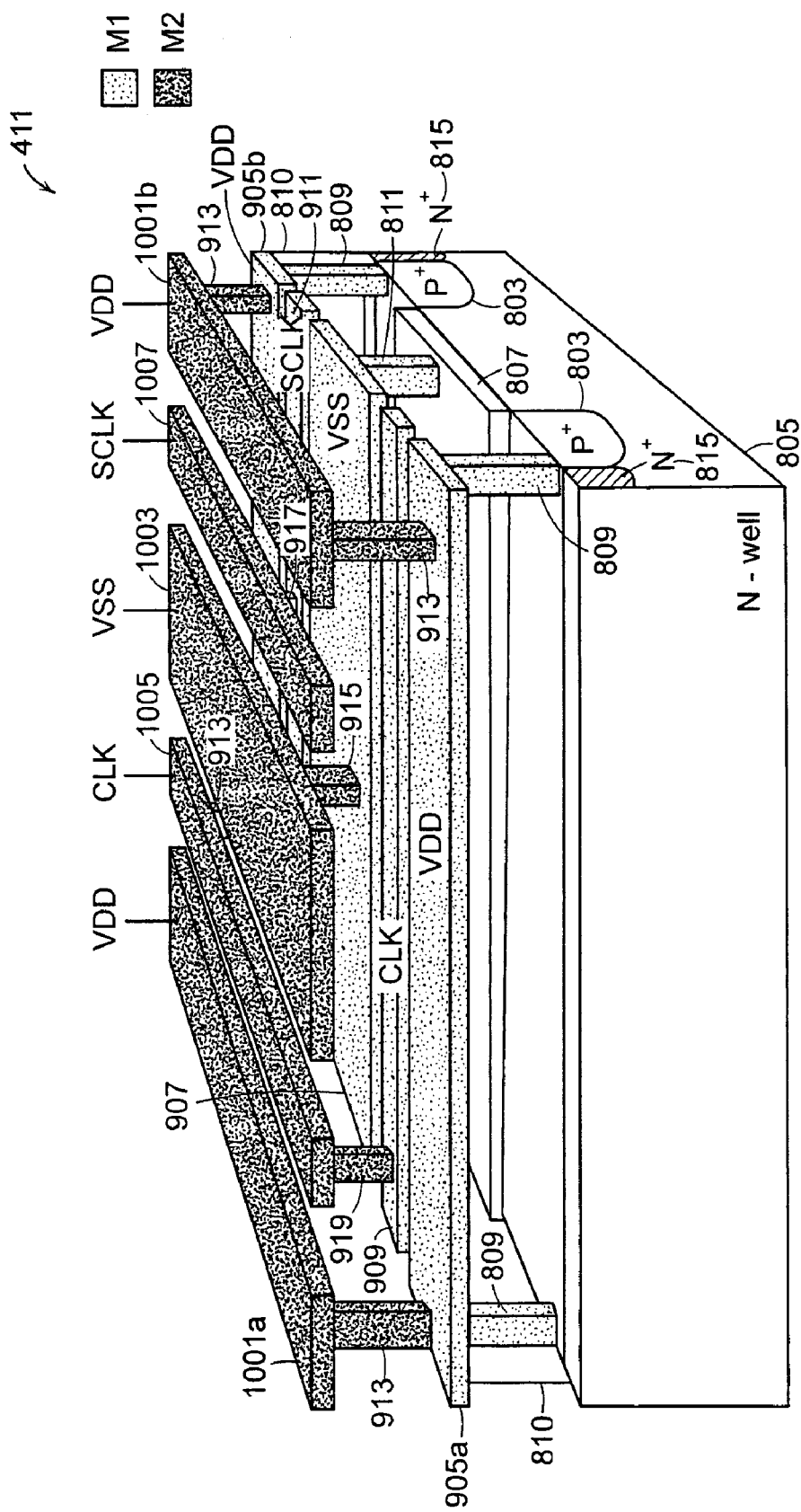
FIG. 12 shows a perspective view of the corner grid unit cell of FIG. 11.

FIG. 11 shows a plan view of a corner grid unit cell 411 and FIG. 12 shows a perspective view of the corner grid unit cell 411. The corner grid unit cell 411 contains power and clock elements in both the horizontal and vertical directions. All of the elements comprising a horizontal orientation are fabricated on the first metal layer M1 and all of the elements comprising a vertical orientation are fabricated on the second metal layer M2. Two p+ source/drains 803 and two n+ well taps 815 are diffused into the n-type well 805. A gate oxide 807 is deposited between the two p+ source/drains 803 and covered by a conductive poly-silicon material forming the mos-fet gate 807a. It should be appreciated that the corner grid unit cell 411 may also comprise an NMOS transistor configuration.

First horizontal power rails 905a and 905b, for example VDD voltage rails, are fabricated on the first metal layer M1 and are connected to the p+ source/drains 803 through contacts 809 and are also connected to n+ well taps 815 through contacts 810. A second horizontal power rail 907, for example a VSS voltage rail, is also fabricated on the first metal layer M1 and is connected to the gate 807a through contact 811. Horizontal clock lines 911 and 909, for example sclk and clk, respectively, are located on metal layer M1 between power rails 905 and 907. Specifically, clock line 911, sclk, is situated between power rails 905b and 907. Clock line 909, clk, is situated between power rails 905a and 907.

First vertical power rails 1001a and 1001b, for example VDD voltage rails, are fabricated on metal layer M2 and are connected to first horizontal power rails 905a and 905b by a via 913. A second vertical power rail 1003, for example a VSS voltage rail, is also fabricated on the second metal layer M2 and is connected to horizontal power rail 907 by via 915. Vertical clock lines 1005, clk, and 1007, sclk, are connected to horizontal clock lines 909, clk, and 911, sclk, through vias 919 and 917 respectively.

Since the corner grid unit 411 comprises all of the elements found in both the vertical and horizontal grid units, 407 and 409 respectively, the corner grid unit is therefore able to couple the vertical and horizontal grid unit cells.

The examples provided thus far have comprised two power VDD rails, one power VSS rail, and two clock lines sclk and clk. It should be appreciated that other combinations involving a different number of voltage rails and clock lines may be used. Combinations involving different orientations may also be implemented. The orientations of M1 and M2 may also be varied.

The integration of the power and clock grids not only reduces clock skew in an application which is easily implemented by ASIC tools, but it also provides decoupling and shielding without adding additional devices to the ASIC design. Another advantage of the integrated clock and power grid is that the design is capable of being fabricated on fewer metal layers, thus greatly lowering the complexity of the ASIC design.

While this invention has been particularly shown and described with references to preferred embodiments thereof, it will be understood by those skilled in the art that various changes in form and details may be made therein without departing from the scope of the invention encompassed by the appended claims.

What is claimed is:

1. A circuit formed from a plurality of design cells comprising:
    grid design cells that are tiled together to form an integrated power and clock grid that includes an integrated power and clock conduction grid having conduction grid sections in first and second orientations and regular crossing intersections between the integrated power and clock conduction grid sections in the first and second orientations, each grid design cell including at least one power rail and at least one clock line extending a length of the grid design cell in at least one of the first and second orientations; and
    circuit design cells forming circuits within and coupled to the integrated power and clock grid.

2. The circuit as claimed in claim 1, wherein a decoupling capacitance is provided between power and ground lines in each grid design cell.

3. The circuit as claimed in claim 1, wherein a clock portion of the integrated power and clock grid is shielded by a power portion of the integrated power and clock grid.

4. The circuit as claimed in claim 1, wherein the at least one power rail and the at least one clock line are comprised in the same metal layer.

5. The circuit as claimed in claim 1, wherein each grid design cell comprises at least one power rail and at least one clock line in the second orientation and at least one other power rail in the first orientation.

6. The circuit as claimed in claim 1, wherein each grid design cell comprises at least one power rail and at least one clock line in each of the first and second orientations.

7. The circuit as claimed in claim 6, wherein each grid design cell interconnects the power rails of different orientation and clock lines of different orientation.

8. The circuit as claimed in claim 1, wherein each grid design cell is formed such that neighboring grid design cells are electrically coupled to each other by abutment.

9. The circuit as claimed in claim 1, wherein a software tool is used to form the integrated power and clock grid.

10. The circuit as claimed in claim 9, wherein the software tool is an ASIC software tool.

11. A computer-implemented method of designing a circuit comprising:
    designing an integrated power and clock grid, the integrated power and clock grid including an integrated power and clock conduction grid having conduction grid sections in first and second orientations and regular crossing intersections between the integrated power and clock conduction grid sections in the first and second orientations, of individual grid design cells tiled together, each grid design cell including at least one power rail and at least one clock line extending a length of the grid design cell in at least one of the first and second orientations; and
    designing a circuit of individual circuit design cells within and coupled to the integrated power and clock grid by using a computer.

12. The method as claimed in claim 11, further comprising:
    placing the individual grid design cells with use of a software tool; and
    placing the individual circuit design cells with use of the software tool.

13. The method as claimed in claim 11, wherein the software tool is an ASIC software tool.

14. The method as claimed in claim 11, further comprising:
    shielding a clock portion of the integrated power and clock grid with a power portion of the integrated power and clock grid.

15. The method as claimed in claim 11, further comprising:
    providing a decoupling capacitance using a power portion of the integrated power and clock grid.

16. The method as claimed in claim 11, further comprising:
    providing the at least one power rail and the at least one clock line in the same metal layer.

17. The method as claimed in claim 11, wherein the individual grid design cells comprise the at least one power rail and the at least one clock line in the second orientation and at least one other power rail in the first orientation.

18. The method as claimed in claim 11, wherein the individual grid design cells comprise at least one power rail and at least one clock line in each of the first and second orientations.

19. The method as claimed in claim 18, further comprising:
    providing an interconnection, wherein the grid design cell interconnects the power rails of different orientation and clock lines of different orientation.

20. The method as claimed in claim 19, wherein the interconnection is provided by abutment of neighboring grid design cells.

21. A computer-implemented method of providing an integrated power and clock grid comprising:

placing individual grid design cells with an ASIC tool by using a computer, wherein the grid design cells comprise voltage and clock elements, to form an integrated power and clock grid, the integrated power and clock grid including an integrated power and clock conduction grid having conduction grid sections in first and second orientations and regular crossing intersections between the integrated power and clock conduction grid sections in the first and second orientations, each grid design cell further including at least one power rail and at least one clock line extending a length of the grid design cell in at least one of a first and second orientations; and placing individual circuit design cells with the ASIC tool by using a computer.

22. A design system comprising:

at least one circuit design cell;

a plurality of grid design cells forming an integrated power and clock grid, the integrated power and clock grid including an integrated power and clock conduction grid having conduction grid sections in first and second orientations and regular crossing intersections between the integrated power and clock conduction grid sections in the first and second orientations, each grid design cell further including at least one power rail and at least one clock line extending a length of the grid design cell in at least one of a first and second orientations;

placing software, wherein the placing software places the plurality of grid design cells and the at least one circuit design cell; and routing software, wherein the routing software provides interconnections between the plurality of grid design cells, the at least one circuit design cell and the plurality of grid design cells, and between the at least one circuit design cell and at least one other circuit design cell.

* * * * *

UNITED STATES PATENT AND TRADEMARK OFFICE
CERTIFICATE OF CORRECTION

| | | |
|---|---|---|
| PATENT NO. | : 7,761,831 B2 | Page 1 of 1 |
| APPLICATION NO. | : 11/322160 | |
| DATED | : July 20, 2010 | |
| INVENTOR(S) | : Tony Mai et al. | |

It is certified that error appears in the above-identified patent and that said Letters Patent is hereby corrected as shown below:

Title Page 1, Item (73), Assignee: delete "Kanata" and insert --Ottawa--.

Column 10, Claim 13, line 39, delete "11" and insert --12--.

Signed and Sealed this

Sixteenth Day of November, 2010

David J. Kappos
*Director of the United States Patent and Trademark Office*